United States Patent
Isoda et al.

(10) Patent No.: US 8,164,030 B2
(45) Date of Patent: Apr. 24, 2012

(54) HEATING COOKER WITH TOUCH PANEL HAVING USER GUIDING ILLUMINATION FUNCTION

(75) Inventors: Keiko Isoda, Hyogo (JP); Ryuuji Nagata, Hyogo (JP); Chikashi Satou, Hyogo (JP); Tsuyoshi Inada, Osaka (JP)

(73) Assignee: Panasonic Corporation, Osaka (JP)

( * ) Notice: Subject to any disclaimer, the term of this patent is extended or adjusted under 35 U.S.C. 154(b) by 404 days.

(21) Appl. No.: 12/374,621

(22) PCT Filed: Jul. 26, 2007

(86) PCT No.: PCT/JP2007/064658
§ 371 (c)(1), (2), (4) Date: Jan. 21, 2009

(87) PCT Pub. No.: WO2008/013220
PCT Pub. Date: Jan. 31, 2008

(65) Prior Publication Data
US 2009/0261088 A1    Oct. 22, 2009

(30) Foreign Application Priority Data
Jul. 27, 2006   (JP) .................. 2006-204364

(51) Int. Cl.
H05B 3/02 (2006.01)
F09V 9/16 (2006.01)
H03K 17/975 (2006.01)
G09G 3/30 (2006.01)

(52) U.S. Cl. ......... 219/489; 200/600; 345/170; 362/184

(58) Field of Classification Search .................. 219/489, 219/506, 440, 492, 501, 507, 508, 663, 667, 219/668, 704, 710, 720, 297; 345/170, 173, 345/174, 178; 200/310–314, 5 A, 5 R, 341–345, 200/600; 392/309, 310; 362/92
See application file for complete search history.

(56) References Cited

U.S. PATENT DOCUMENTS
4,308,443 A * 12/1981 Tucker et al. .................. 219/627
(Continued)

FOREIGN PATENT DOCUMENTS
DE       10148897 A1    6/2003
(Continued)

OTHER PUBLICATIONS
International Search Report issued Oct. 16, 2007 in International application No. PCT/JP2007/064658 4 pages.
(Continued)

Primary Examiner — Geoffrey S Evans
Assistant Examiner — Thomas Ward
(74) Attorney, Agent, or Firm — Brinks Hofer Gilson & Lione

(57) ABSTRACT

An appliance including a top plate has its operability improved and prevents an operation error. The appliance includes electrostatic touch keys provided on a lower surface of the top plate, the electrostatic touch keys including electrodes made of conductive films having predetermined light-blocking property, respectively, operation-unit illuminators emitting light toward the electrodes, which are partially cut, from a direction opposite to the top plate, respectively, and an illumination controller controlling illumination of the operation-unit illuminators. The illumination controller changes the illumination state of the shapes of key indicators above the electrodes to allow a user to identify function and validity of the electrostatic touch keys. The illumination controller controls the illumination state of operation-unit illuminators, such as lighting-on, blinking, lighting-off, and adjusting the brightness, to provide information required for operation.

15 Claims, 9 Drawing Sheets

U.S. PATENT DOCUMENTS

| | | | | |
|---|---|---|---|---|
| 4,446,350 | A | * | 5/1984 | Mizukawa et al. ............ 219/622 |
| 5,876,106 | A | * | 3/1999 | Kordecki ........................ 362/29 |
| 7,499,003 | B2 | * | 3/2009 | Rudolph et al. ................ 345/56 |

FOREIGN PATENT DOCUMENTS

| | | |
|---|---|---|
| DE | 102004026836 A1 | 12/2005 |
| FR | 2759769 A1 | 8/1998 |
| GB | 2323436 A | 9/1998 |
| JP | 2001-51777 A | 2/2001 |
| JP | 2003-142244 A | 5/2003 |
| JP | 2003-208972 A | 7/2003 |
| JP | 2004-247186 A | 9/2004 |
| JP | 2005-38739 A | 2/2005 |
| JP | 2005-038739 A | 2/2005 |
| JP | 2005-265212 A | 9/2005 |
| JP | 2005-268208 A | 9/2005 |
| WO | WO 2007/043505 A1 | 4/2007 |

OTHER PUBLICATIONS

Extended European Search Report for European Application No. 07791358.0, dated Jul. 27, 2010, 7 pages.

Translation of paragraphs 55 and 57 from DE 102004026836 A1, 1 page.

* cited by examiner

HEATING COOKER WITH TOUCH PANEL HAVING USER GUIDING ILLUMINATION FUNCTION

TECHNICAL FIELD

The present invention relates to a heating cooker having an operation guidance function.

BACKGROUND ART

FIG. 9 is a block diagram of conventional electronic appliance 100 having an operation guidance function. Electronic appliance 100 includes data bus 101. Memory 102 is connected to data bus 101, stores operation guidance corresponding to a specification of electronic appliance 100. The operation guidance is produced by previously determining operation procedures of electronic appliance 100.

Memory 102 includes a read-only memory (ROM). Indicator 103 is connected to memory 102 via data bus 101, and displays the operation guidance read from memory 102. In this case, the operation guidance includes a series of operation procedures having a hierarchical structure to perform predetermined functions. Indicator 103 includes a liquid crystal display (LCD).

Selector 104 is connected to indicator 103 via data bus 101, and is operated by a user to select a desired item from the operation guidance displayed on indicator 103. In this case, indicator 103 displays options to allow the user to select a desired function of electronic appliance 100, and selector 104 is operated by the user to select a desired function from the options.

Illumination actuator 106 is connected to selector 104 via data bus 101 and I/O interface 105. Upon being operated, selector 104 allows particular illumination actuator to emit light. In this case, illumination actuator 106 includes a push button, a rotary element, such as a jog dial, a lid, such as a cassette container, and a table, such as a CD tray.

Each illumination actuator 106 has a colored light source mounted thereto. The light source is a light emitting diode (LED). The LED blinks for the user to pay attention.

The blinking notifies the user of the position of illumination actuator 106. Indicator 103 displays a title of illumination actuator 106 to allow the user to acknowledge the title and position of illumination actuator 106 without requiring reading an operation manual.

Sound generator 107 is connected to data bus 101, and generates an operation sound, such as a beeping sound, upon the user touching illumination actuator 106 blinking.

This beeping sound notifies the user to acknowledge that a particular push button is pushed. This pushing operation of the push button triggers reading information on the next operation guidance from memory 102 to indicator 103.

An alarm, such as repetitive beeping sound, may be generated when illumination actuator 106 which does not blink is touched. Sound generator 107 includes sound processor 107A generating the operation sound, such as the beeping sound, and the alarm, such as repetitive beeping sounds; and speaker 107B producing these sounds. An audio apparatus includes sound processor 107A and speaker 107B, and thus they may be shared.

Sound generator 107 has controller 108 connected thereto through data bus 101. Controller 108 exercises generation control on sound generator 107 so that operation of illumination actuator 106 is acknowledged. Controller 108 is formed of a CPU (central processing unit) and other components. Further, controller 108 controls indicator 103 so as to display a next operation procedure and exercises illumination control so as to make illumination actuator 106 indicating next operation emit light. The order of making illumination actuator 106 emit light is preliminarily stored in memory 102.

In addition to memory 102, indicator 103, selector 104, I/O interface 105, sound generator 107, and controller 108, data bus 101 is connected to mode selector 109. Mode selector 109 is operated by the user to select an operation guidance mode or a non-operation-guidance mode. Here, the operation guidance mode is a mode in which the user is guided to perform a functional operation of electronic appliance 100. The non-operation-guidance mode is a mode in which the user does not perform the operation guiding.

Electronic appliance 100 operates in the non-operation-guidance mode when operating normally. The operation guidance mode is selected through mode selector 9 only when the operation guidance function is desired to be used. Therefore, the non-operation-guidance mode does not require selecting through mode selector 109.

The user may forget a method of operate electronic appliance 100 when the user executes an infrequently function, or when the user loses the operation manual. In these cases, the user can use the operation guidance function by selecting the operation guidance mode through mode selector 109 without requiring reading the manual. Functional object 110 is connected to data bus 101. Functional object 110 is a part performing a primary function controlled by electronic appliance 100 (see Patent Document 1). In a heating cooker, for example, the functional object is a heat source, such as an induction heating coil, a sheath heater, a nickel-chromium wire, and a magnetron.

However, in the conventional structure, the user always sees the illumination actuators, such as a push button, and a rotary element, such as a jog dial, while the actuators are not lit. Even if the illuminator of only an operable operation unit emits light with a colored light source, the user may operate an illumination actuator which is not illuminated.

If the user operates an invalid illumination actuator which is not illuminated, an alarm (e.g. repeated beeping sounds) is generated. However, the alarm may confuse the user to remind the user of information (e.g. failure, expiry of a timer) other than an operation error to confuse the user.

Patent Document 1: JP2001-51777A

SUMMARY OF THE INVENTION

The present invention provides a heating cooker preventing a malfunction to solve the conventional problems.

A heating cooker according to the invention includes: a top plate placed on an upper surface of the heating cooker; electrostatic touch keys provided on a lower surface of the top plate, the electrostatic touch keys including electrodes made of conductive films having predetermined light-blocking property, respectively, the electrostatic touch keys directing to perform functions allocated thereto, respectively; an operation sensor detecting changes of capacitances with respect to a ground, the changes of the capacitances being produced by touching portions of the top plate facing the electrodes while applying an alternating-current signal to the electrodes, respectively; operation-unit illuminators emitting light toward the electrodes from a direction opposite to the top plate, respectively; and an illumination controller controlling illumination of the operation-unit illuminators. The electrostatic touch keys include key indicators inside the electrodes, respectively, each of the key indicators including a portion having each of the conductive films thereon and a portion not having each of the conductive films thereon, the portion not having each of the conductive films thereon being surrounded by the portion having each of the conductive films thereon. The illumination controller allows the operation-unit illuminators to emit light, the electrodes block the light emitted from the operation-unit illuminators, and the key indicators transmit the light to illuminate to be visible through the top plate.

When the operation-unit illuminators emit light, the key indicators illuminate and appear in the top plate to allow a user to easily identify their functions and accurate positions of the electrostatic touch keys. The key indicators can be invisible to the user upon the operation-unit illuminators not emitting light. For example, when the electrostatic touch keys are inoperable, the operation-unit illuminators do not emit light so as to allow the user to select only the illuminating electrostatic touch keys, thereby preventing the user from erroneously operating the cooker.

The illumination controller may change the illumination state of the operation-unit illuminators every time the cooker is operated. For example, the controller may change the illumination state of the indicators provided on the electrodes according to the current validity, order of priority, and other conditions of the electrostatic touch keys. The user presses the top plate at an illuminating key indicator while looking at a display formed with the key indicators changing every time an operation procedure is executed. Thereby, the user can easily selects a necessary operation procedure from plural procedures to properly operate the electronic appliance without reading an operation manual.

The key indicators visible to the user are formed on the electrodes, and thus, the user can press the visible key indicators to operate the cooker, thus being prevented from erroneously operating the cooker. This structure eliminates a space dedicated to displaying for illuminating the electrostatic touch keys around electrodes.

In the case that a necessary electrostatic touch key is selected from the keys, or in the case that a single electrostatic touch key is shared to perform plural functions in order to reduce the number of the electrostatic touch keys, the user can easily select a proper electrostatic touch key to operate the appliance without malfunction, thereby improving usability of the cooker.

REFERENCE NUMERALS

Figure 1:
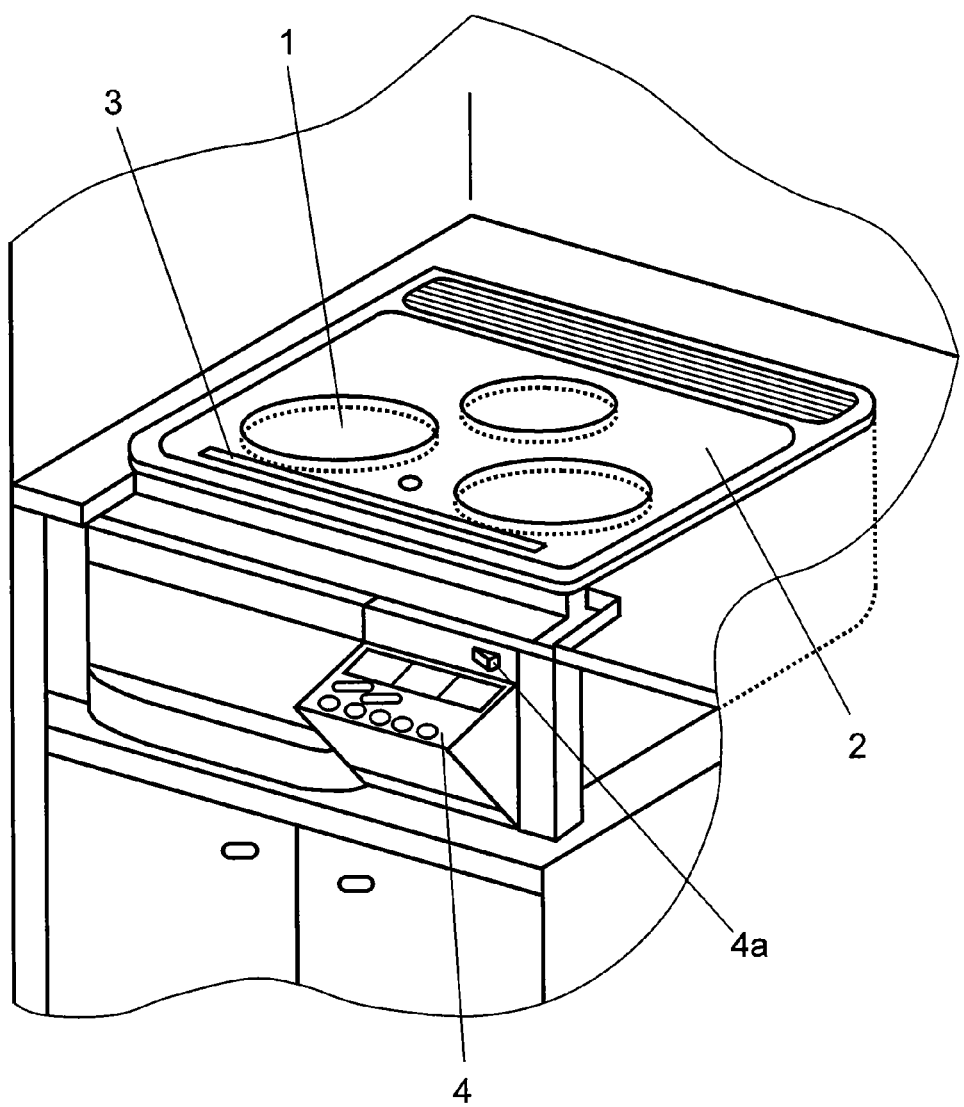
FIG. 1 is a perspective view of a heating cooker according to Exemplary Embodiments 1 to 3 of the present invention.

2 Top Plate
3 Top-Panel Operation Unit
4*a* Power Switch
5, 14 Electrostatic Touch Key
5*b* Electrode
5*c* Function Indicator (Key Indicator)
5*d* Range Indicator (Key Indicator)
6 Operation Sensor
7 Light-Guiding Panel (Operation-Unit Illuminator)
8 Illumination Controller
12 Memory
13 Sound Generator
15 Guidance Operation Selector

DETAILED DESCRIPTION OF PREFERRED EMBODIMENTS

In an aspect of the present invention, a heating cooker includes: a top plate placed on an upper surface of the heating cooker; electrostatic touch keys provided on a lower surface of the top plate, the electrostatic touch keys including electrodes made of conductive films having predetermined light-blocking property, respectively, the electrostatic touch keys directing to perform functions allocated thereto, respectively; an operation sensor detecting changes of capacitances with respect to a ground, the changes of the capacitances being produced by touching portions of the top plate facing the electrodes while applying an alternating-current signal to the electrodes, respectively; operation-unit illuminators emitting light toward the electrodes from a direction opposite to the top plate, respectively; and an illumination controller controlling illumination of the operation-unit illuminators. The electrostatic touch keys include key indicators inside the electrodes, respectively, each of the key indicators including a portion having each of the conductive films thereon and a portion not having each of the conductive films thereon, the portion not having each of the conductive films thereon being surrounded by the portion having each of the conductive films thereon. The illumination controller allows the operation-unit illuminators to emit light, the electrodes block the light emitted from the operation-unit illuminators, and the key indicators transmit the light to illuminate to be visible through the top plate. When the operation-unit illuminators emit light, the key indicators illuminate and appear in the top plate to allow a user to easily identify their functions and accurate positions of the electrostatic touch keys. The key indicators can be invisible to the user upon the operation-unit illuminators not emitting light. For example, when the electrostatic touch keys are inoperable, the operation-unit illuminators do not emit light so as to allow the user to select only the illuminating electrostatic touch keys, thereby preventing the user from erroneously operating the cooker. The illumination controller may change the illumination state of the operation-unit illuminators every time the cooker is operated. For example, the controller may change the illumination state of the indicators provided on the electrodes according to the current validity, order of priority, and other conditions of the electrostatic touch keys. The user presses the top plate at an illuminating key indicator while looking at a display formed with the key indicators changing every time an operation procedure is executed. Thereby, the user can easily selects a necessary operation procedure from plural procedures to properly operate the electronic appliance without reading an operation manual. The key indicators visible to the user are formed on the electrodes, and thus, the user can press the visible key indicators to operate the cooker, thus being prevented from erroneously operating the cooker. This structure eliminates a space dedicated to displaying for illuminating the electrostatic touch keys around electrodes. In the case that a necessary electrostatic touch key is selected from the keys, or in the case that a single electrostatic touch key is shared to perform plural functions in order to reduce the number of the electrostatic touch keys, the user can easily select a proper electrostatic touch key to operate the appliance without malfunction, thereby improving usability of the cooker.

In another aspect of the invention, the electrostatic touch keys may be provided on a top-panel operation unit formed on the top plate, and the top-panel operation unit may be colored so as to prevent shapes of the key indicators from being visible while the operation-unit illuminators do not emit light. This arrangement allows the shapes of the key indicators to show clearly while the operation-unit illuminators do not emit light, and disables the shapes to be visible to the user, thereby allowing the user to visibly recognize the shapes easily.

In still another aspect of the invention, the key indicators may include a range indicator having a frame shape or a ring shape so as to indicate an operation range of the electrostatic touch keys. This arrangement allows an operation range of the electrostatic touch keys to appear when the operation-unit illuminators emit light, thereby allowing the user to clearly acknowledge the range. An electrode inside the range indicator electrically is coupled to an electrode outside the range indicator by capacitive coupling, thereby exerting effects as an electrode. The conductive films of the electrodes may be formed by printing to enhance the appearance of the range indicator.

In a further aspect of the invention, the key indicators may include function indicators indicating functions allocated to the electrostatic touch keys, respectively. This arrangement allows the function indicator indicating the function of an electrostatic touch key to appear when the operation-unit illuminators emit light, thereby allowing the user to clearly acknowledge the function. Further, when the user touches a portion of the top plate above the function indicator, the outside electrode electrically coupled to a user's finger by capacitive coupling, thus providing a function as an electrostatic touch key when the portion above the function indicator is touched as well. The conductive film of an electrode may be formed by printing, enhancing the appearance of the function indicator.

In a further aspect of the invention, the heating cooker may include a memory storing an operation guidance determining an illumination state of the operation-unit illuminators while the heating cooker is operated according to a series of operation procedures. The illumination controller changes the illumination state of the operation-unit illuminators according to the operation guidance input from the memory. This arrangement guides the user to operate while changing the illumination state of the key indicators of the electrostatic touch keys according to the operation procedure selected.

In a further aspect of the invention, the illumination controller may allow one of the operation-unit illuminators to emit light when one of the electrostatic touch keys is operable, and may allow said one of the operation-unit illuminators not to emit light when said one of the electrostatic touch keys is inoperable. This arrangement prevents the user from touching an inoperable electrostatic touch key, and allows the user to easily identify an operable electrostatic key.

In a further aspect of the invention, the top-panel operation unit may be constituted by a portion of the top plate, the portion of the top plate being made of colored crystallized ceramic. This arrangement does not require coloring print film to the top-panel operation unit for preventing the electrodes and key indicators from being visible.

In a further aspect of the invention, the top-panel operation unit may have a colored print film formed on the lower surface of the top plate. This arrangement allows the color and light-transmittance of the top-panel operation unit to change only by changing the color of the print film and the thickness of the film while the material of the top plate is common. Further, the top-panel operation unit may have a window produced by partially coloring the top plate. The electrostatic touch keys may be formed inside the window on the top-panel operation unit, thereby allowing the user to easily recognize the range of the top-panel operation unit.

In a further aspect of the invention, the top-panel operation unit may have a film having a half-mirror effect formed on the lower surface of the top plate. This arrangement allows the color, light-transmittance, and reflectivity of the top plate to change only by changing the color of the half-mirror film and the thickness of the film while the material of the top plate is common. Further, it is easy to form, as the top-panel operation unit, a window with a half mirror effect colored differently from its periphery partially in the top plate; to partially color a window with a half mirror effect, where electrostatic touch keys can be formed in the window, which allows the user to easily recognize the range of the top-panel operation unit.

In a further aspect of the invention, sides of the electrodes directed toward the top plate may have colors identical to colors of sides of the operation-unit illuminator directed toward the electrodes, respectively, while the operation-unit illuminators do not emit light. The key indicators have the same color as the sides of the electrodes toward the top plate when the operation-unit illuminators do not emit light. This arrangement prevents the key indicators from being visible to the user, prevents the electrostatic touch key from being touched, and enhances the appearance. When the operation-unit illuminators of an operable operation unit emit light, the key indicators illuminate brightly, allowing shapes, such as characters, figures, and symbols, on the key indicators to be visible.

In a further aspect of the invention, the illumination controller allows one of the operation-unit illuminators to emit light at a predetermined first brightness when one of the electrostatic touch keys is operable, and allows the one of the operation-unit illuminator to emit light at a predetermined second brightness lower than the first brightness when the one of the electrostatic touch keys is inoperable. This operation prevents the user from touching an inoperable electrostatic touch key, and allows the user to identify an operable electrostatic key easily.

In a further aspect of the invention, the illumination controller may allow one of the operation-unit illuminators to blink at a predetermined first period when one of the electrostatic touch keys is operable, and allows the one of the operation-unit illuminator to blink at a predetermined second period longer than the first period when the one of the electrostatic touch keys is inoperable. This operation prevents the user from touching an inoperable electrostatic touch key, and allows the user to identify an operable electrostatic key easily.

In a further aspect of the invention, the heating cooker may include a sound generator generating sound for explaining the meaning of an illumination state of the operation-unit illuminators. This arrangement allows the user to be informed of the next operation visually and aurally, thereby allowing the user to perform the next operation easily and properly.

In a further aspect of the invention, the heating cooker may include a guidance operation selector disabling to perform illumination control on the operation-unit illuminators according to the operation guidance stored in the memory. While the guidance operation selector disables to perform the illumination control, the illumination controller allows all the operation-unit illuminators of all the electrostatic touch keys to inform a user of functions and positions of the electrostatic touch keys when an operation on at least one of the electrostatic touch keys is valid. This arrangement allows the user to realize the positions and functions of all the operation-unit illuminators, and thus, the user can heat and cook by an ordinary operation method.

In a further aspect of the invention, the illumination controller may allow the operation-unit illuminators to blink to notify a user that an operation is accepted. This operation allows the user to visually acknowledge the acceptance of the user's operation by the blinking of the operation-unit illuminators, thereby preventing unnecessary operation, namely repeating the same operation due to ignorance of the acceptance of the input operation.

In a further aspect of the invention, the heating cooker may include a power switch. The electrostatic touch keys may include a lock release key for releasing a lock state in which electrostatic touch keys other than the lock release key are inoperable, and for allowing the other electrostatic keys to be operable. Upon being turned on, the power switch shifts from a state that all the electrostatic touch keys are inoperable to the lock state. The illumination controller may be operable to, upon the power switch being turned on, the operation-unit illuminators of the electrostatic touch keys emit light for a predetermined time, then, turn off the light. The controller is operable to, after operation-unit illuminators turn off the light, only an operation-unit illuminator of the operation-unit illuminators illuminating the lock release key emits light. The controller may be operable to, after only the operation-unit illuminator of the operation-unit illuminators illuminating the lock release key emits light, the operation-unit illuminator illuminating the lock release key does not emit light if the lock state is released. This arrangement allows the user to be informed of what functions the appliance provides before the electrostatic touch key turns off.

Exemplary embodiments of the present invention will be described below with reference to the accompanied drawings. The present invention is not limited to these embodiments.

Exemplary Embodiment 1

FIG. 1 is a perspective view of a heating cooker according to exemplary Embodiment 1 of the present invention.

In FIG. 1, this heating cooker essentially includes top plate 2 provided on an upper surface of the heating cooker and arranged to have an object (not shown) to be placed thereon, heater unit 1 indicated by a circular pattern printed with film on a lower surface of top plate 2, top-panel operation unit 3 formed on top plate 2 in front of heater unit 1, and kangaroo-type operation unit 4 retractable on a front surface of the heating cooker. Top plate 2 has a plate shape and made of insulating material, such as heat-resistant glass of crystallized ceramic, having high heat resistance and light-transmittance. An induction heating coil (not shown) generating a high-frequency magnetic field is provided below heater unit 1 in the cooker, and faces heater unit 1. At least top-panel operation unit 3 on top plate 2 is colored in black, and the other portions of top plate 2 are entirely colored in silver. Top-panel operation unit 3 has a print film in color with low light-transmittance formed on the lower surface of top plate 2 to be colored. Top-panel operation unit 3 allows light from an illuminator under top plate 2 to be visible when the illuminator emitting the light, and prevents the illuminator from being visible when the illuminator does not emit light. Here, the method of coloring is not limited to this method. Instead of forming the print film, a deposited film with a half mirror effect may be formed. Instead of forming the colored film, material, such as crystallized ceramic, itself of top plate 2 may be colored. In this case, top-panel operation unit 3 may not necessarily have a print film for coloring formed thereon for preventing electrode 5b and key indicators 5c and 5d from being visible. Top-panel operation unit 3 may have a window formed therein, as shown in FIG. 1. The window may have color which may be different from the other portions of top plate 2 and may be the same as the other portions of top plate 2. For example, top plate 2 is colored entirely in dark brown, and a part of top plate 2 may function as top-panel operation unit 3. In this case, top-panel operation unit 3 may be indicated by printing a frame of a bright line surrounding top-panel operation unit 3. The window indicating top-panel operation unit 3 may not be necessary. The window indicating top-panel operation unit 3 allows a user can easily recognize a range where electrostatic touch key 5 exists.

Figure 2:
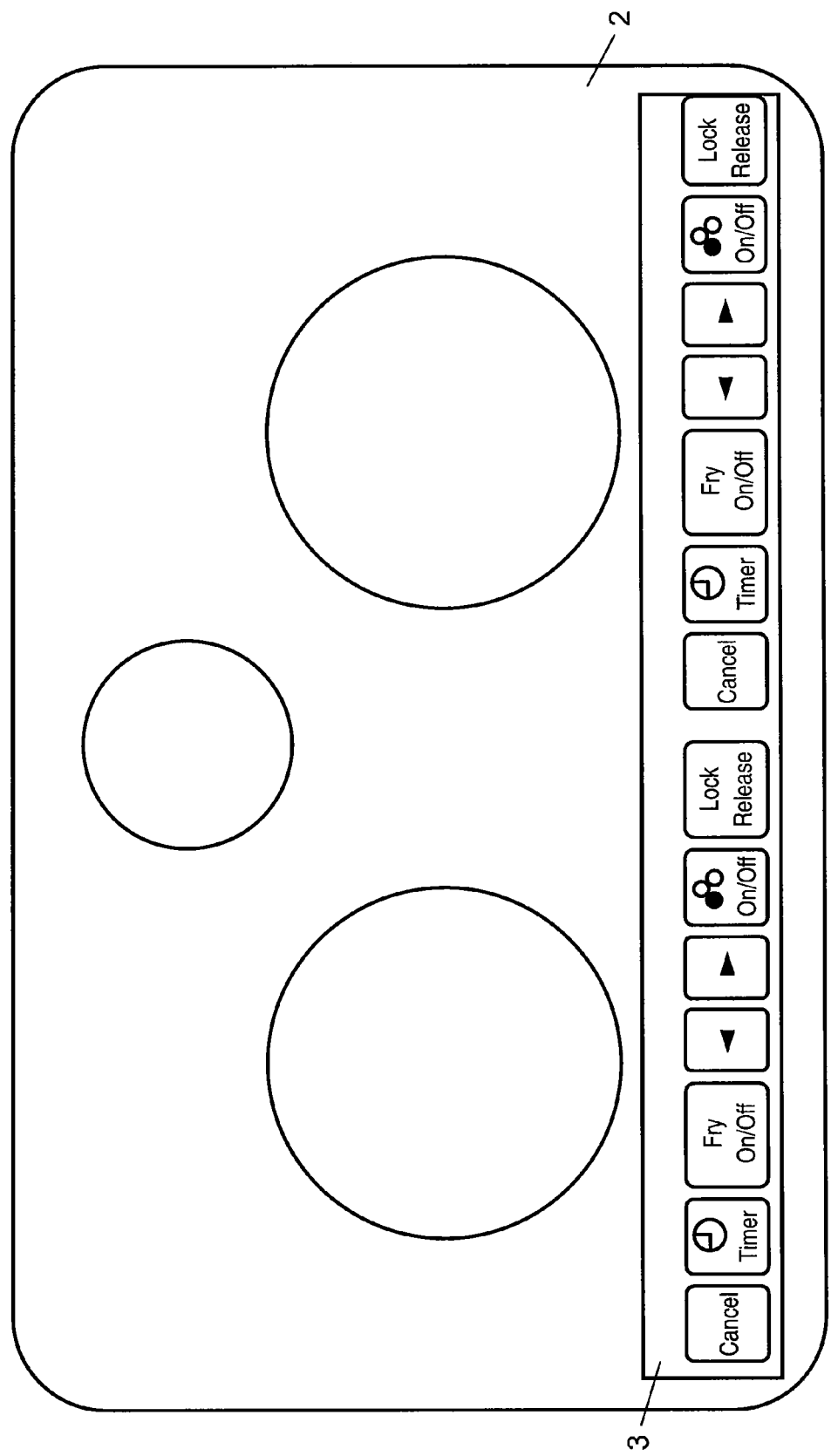
FIG. 2 is a top view of a top plate of the heating cooker according to Embodiments 1 to 3 of the invention.
Figure 3:
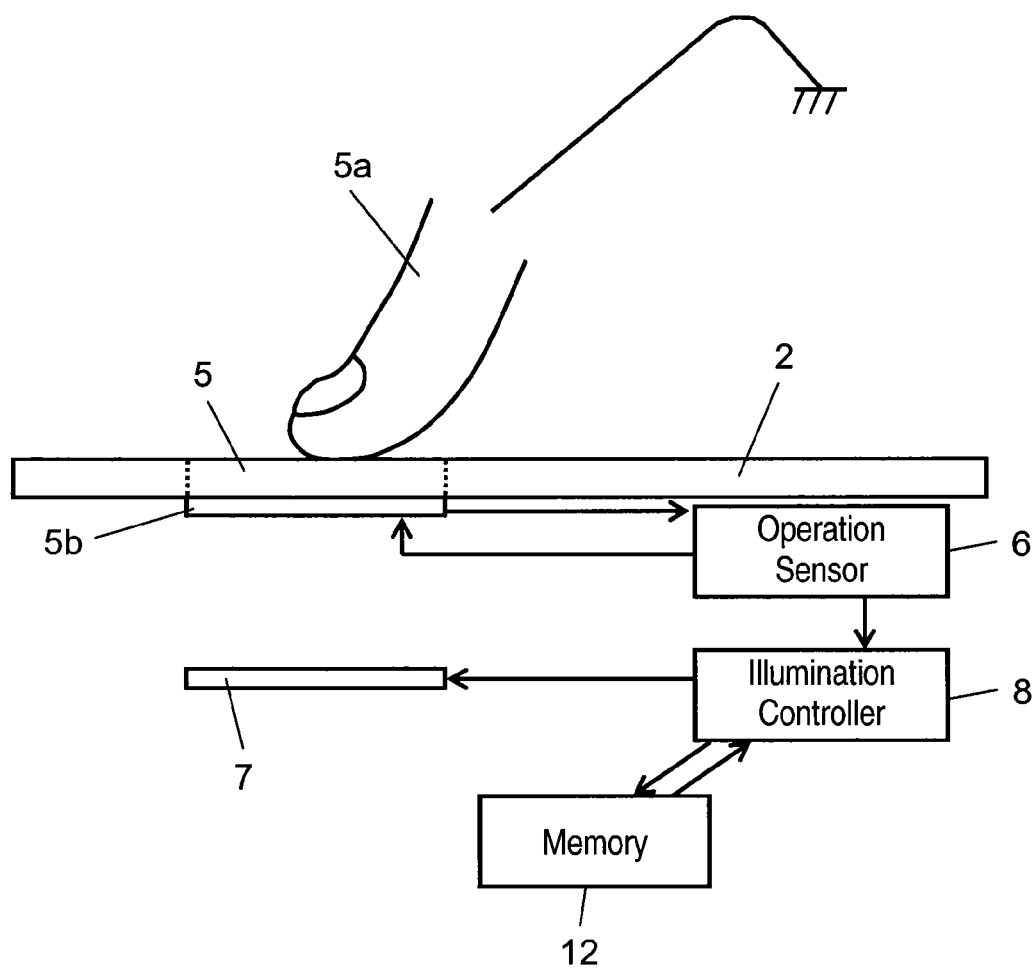
FIG. 3 is a block diagram of an operation unit according to Embodiments 1 to 3 of the invention.

FIG. 2 illustrates top plate 2 of the heating cooker according to Embodiment 1 viewed from above. FIG. 3 is a block diagram of the operation unit of the heating cooker of according to Embodiment 1 of the invention.

As shown in FIG. 3, the operation unit essentially includes electrostatic touch key 5 having electrode 5b on the lower surface of a part of top plate 2 operated with finger 5a pressing touch key 5, operation sensor 6, light-guiding panel 7, which is an operation-unit illuminator emitting light from below electrode 5b toward above, and illumination controller 8. The operation unit further includes memory 12 storing operation guidance at a level corresponding to a specification of the heating cooker. Illumination controller 8 controls illumination of light-guiding panel 7 according to the operation guidance stored in memory 12.

Electrostatic touch key 5 forms a capacitor between finger 5a and electrode 5b. Electrode 5b is provided on a surface of top plate 2 opposite to a surface of top plate 2 arranged to have an object (not shown) placed thereon, namely, on the lower surface of top plate 2. Finger 5a touching the surface arranged to have the object (not shown) placed thereon. A high-frequency voltage is applied to electrode 5b from an oscillator (not shown) in operation sensor 6.

Operation sensor 6 detects that electrostatic touch key 5 is operated by detecting that the voltage appears on electrode 5b drops by more than a predetermined difference due to impedance between electrode 5b and a common potential decreasing when finger 5a touches the upper surface of top plate 2 above electrode 5b to bypass a high-frequency current to a ground through top plate 2 and finger 5a.

Figure 4A:
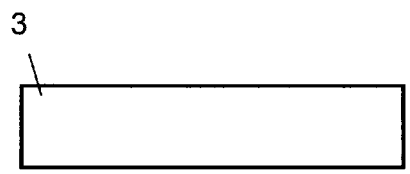
FIG. 4A is a top view of the operation unit when a light-guiding panel does not emit light.
Figure 4C:
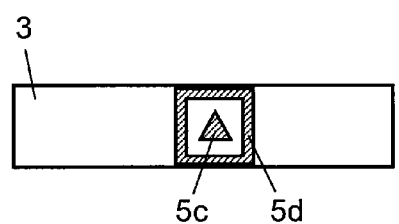
FIG. 4C is a top view of the operation unit when the light-guiding panel emits light.
Figure 4B:
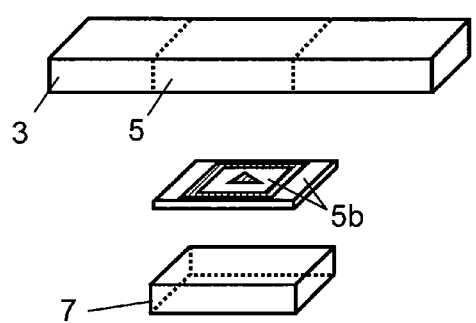
FIG. 4B is a perspective view of the operation unit when the light-guiding panel emits light.
Figure 4D:
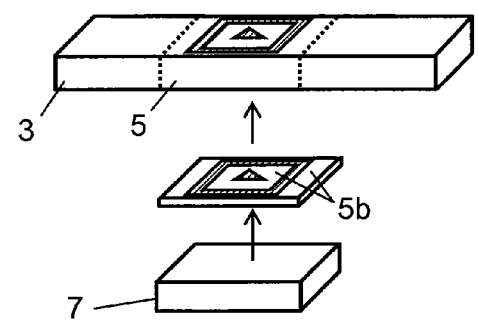
FIG. 4D is a perspective view of the operation unit when the light-guiding panel emits light.

FIG. 4A is a top view of top-panel operation unit 3 when light-guiding panel 7 does not emit light. FIG. 4B is a perspective view of top-panel operation unit 3 when light-guiding panel 7 does not emit light. FIG. 4C is a top view of top-panel operation unit 3 when light-guiding panel 7 emits light. FIG. 4D is a perspective view of top-panel operation unit 3 when light-guiding panel 7 emits light.

Electrode 5b is made of conductive film having predetermined light-blocking property, hence disabling the light to transmit to the upper surface of top plate 2 or preventing light from transmitting to the upper surface of top plate 2 while light-guiding panel 7 emit the light. The conductive film may be made of metal film, such as copper foil, having low light-transmittance, or black, conductive paint. As shown in FIGS. 4B and 4D illustrating electrode 5b, key indicators 5c and 5d are formed on top plate 2 by removing only portions of the conductive film having figures to be illuminated so as to allow key indicators 5c and 5d to transmit light. Here, hatched portions of electrode 5b shown in FIGS. 4B and 4D represent key indicators 5c and 5d and illustrates that the portions of the conductive film at key indicators 5c and 5d are removed.

Top-panel operation unit 3, a portion of top plate 2 where electrostatic touch key 5 above electrode 5b exists, has a print film formed in color (e.g. black, dark brown, dark red) with low light-transmittance the lower surface of top plate 2. Consequently, as shown in FIG. 4B, nothing appears on the upper surface of top plate 2 when light-guiding panel 7 does not emit light, as shown in FIG. 4A. When light-guiding panel 7 emits light, as shown in FIG. 4D, a portion of electrode 5b covered with the conductive film does not transmit the light, and remains the color of top plate 2. The light emitted by light-guiding panel 7 transmits through key indicators 5c and 5d and through top plate 2 and the print film having light-transmittance forming top-panel operation unit 3, thereby displaying the figures of key indicators 5c and 5d on the upper surface, as shown in FIG. 4C, to be visible to the user. In FIGS. 4C and 4D, the hatched portions of top plate 2 indicate that the portions illuminate.

Thus, light-guiding panel 7 arranged beneath electrostatic touch key 5 emits light to allow electrostatic touch key 5 look emitting light from itself.

In FIGS. 4A to 4D, key indicators 5c and 5d, portions of electrode 5b where the conductive film is removed, have a triangle shape and a frame shape, respectively, and these figures appear on the upper surface of top plate 2. However, as shown in FIGS. 5A to 5C, 6A to 6C, 8A, and 8B, key indicators 5c and 5d serve as range indicator 5d produced by removing the conductive film into a frame shape, and function indicator 5c produced by removing the metal into various shapes, such as characters, symbols, and figures. Thus, function indicator 5c indicating a function allocated to electrostatic touch key 5, and range indicator 5d indicating an operation range of electrostatic touch key 5 appear on the upper surface of top plate 2.

Then, top-panel operation unit 3 provided on a partial area of top plate 2 includes plural (fourteen in FIG. 2) electrostatic touch keys 5 shown in FIGS. 4A to 4D arranged laterally combined with the same number of light-guiding panels 7, respectively.

When light-guiding panel 7 in electrostatic touch key 5 forming top-panel operation unit 3 emits light, the characters of function indicator 5c and the frame shape of range indicator 5d shown in FIG. 2 illuminate on the upper surface of top plate 2, i.e., on top-panel operation unit 3. The portion of top plate 2 forming top-panel operation unit 3 has the print film in color having low light-transmittance formed thereon, and thus, nothing appears on the upper surface of the portion part of top plate 2 forming top-panel operation unit 3 when light-guiding panel 7 does not emit light. Instead of the operation that nothing appears on the upper surface of the portion of top plate 2 forming top-panel operation unit 3, key indicators 5c and 5d may be prevented from being visible while light-guiding panel 7 does not emit light.

Figure 5A:
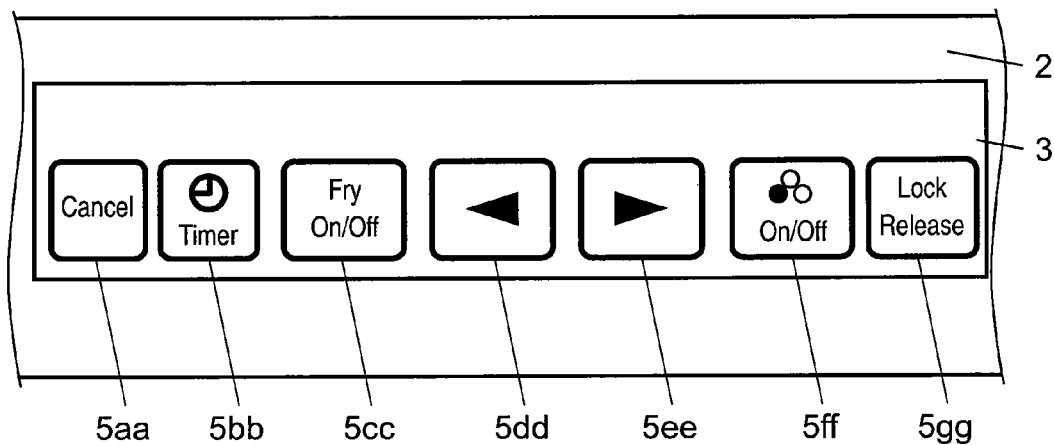
FIG. 5A is a top view of a top-panel operation unit while all light-guiding panels emit light in a part of the top-panel operation unit.
Figure 5B:
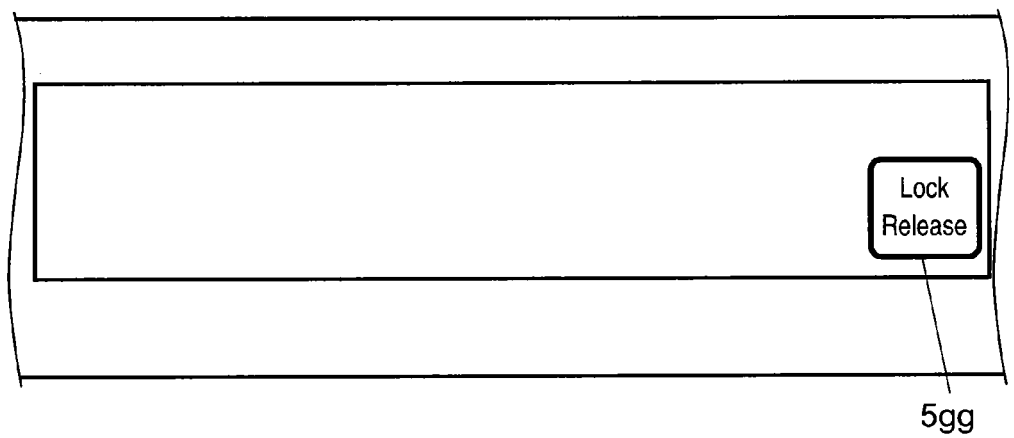
FIG. 5B is a top view of the top-panel operation unit while one light-guiding panel emits light in the part of the top-panel operation unit.
Figure 5C:
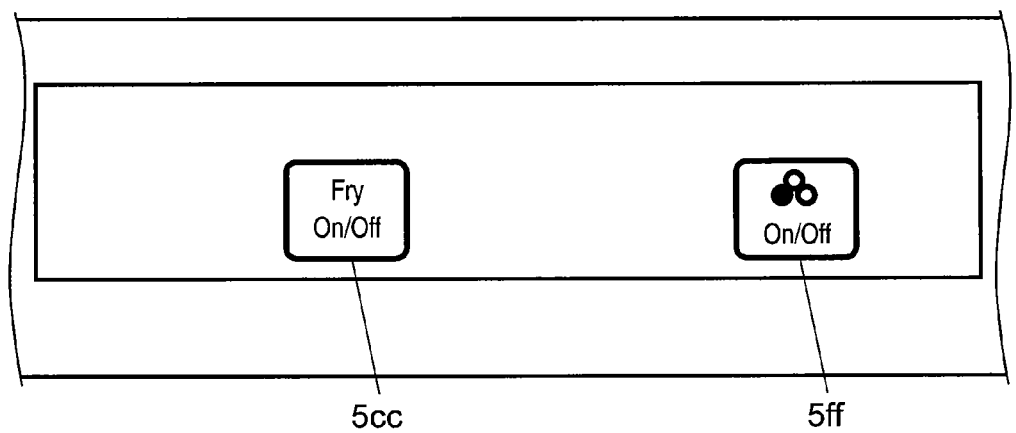
FIG. 5C is a top view of the top-panel operation unit while three light-guiding panels emit light in the part of the top-panel operation unit.

FIG. 5A is a top view of a portion of top-panel operation unit 3 when all light-guiding panels 7 emit light. FIG. 5B is a top view of the portion of top-panel operation unit 3 when one light-guiding panel 7 emits light. FIG. 5C is a top view of the portion of top-panel operation unit 3 when two light-guiding panels 7 emit. Each of electrostatic touch keys 5aa to 5gg represents electrostatic touch key 5 corresponding to each function.

In particular, electrostatic touch key 5gg is a lock release key (referred to as "lock release key 5g" hereinafter) used to release a lock state of the cooker in which the other keys are inoperable. Electrostatic touch key 5cc is a fry start key (referred to as "fry start key 5cc" hereinafter) used to start frying while a heating output is controlled to keep a temperature of oil in a pan, an object (not shown), at a predetermined temperature in a lock release state. Electrostatic touch key 5ff is a heating start key (referred to as "heating start key 5ff" hereinafter) used to start heating other than frying in a lock release state.

An operation of the heating cooker will be described below.

First, power switch 4a turns on and off the cooker. Power switch 4a is implemented by mechanical contacts giving high reliability, and located on the front surface of the cooker, as shown in FIG. 1, on the upper surface of the appliance, or on the kangaroo-type operation unit 4. When power switch 4a is turned off, all electrostatic touch keys 5aa to 5gg become inoperable. For a predetermined time (e.g. a few seconds) after power switch 4a is turned on, all electrostatic touch keys 5aa to 5gg illuminate (although light-guiding panels 7 beneath electrostatic touch keys 5aa to 5gg actually emit light, electrostatic touch keys 5aa to 5gg look emitting the light from themselves, and thus such description is made). After the above predetermined time elapses, the heating cooker shifts to a lock state, and only lock release key 5gg illuminates, as shown in FIG. 5B. At this moment, a key which is operable is only lock release key 5gg. When the user operates lock release key 5gg, operation sensor 6 detects that lock release key 5gg is operated and notifies illumination controller 8 that lock release key 5gg is operated.

Illumination controller 8 establishes a lock release state when lock release key 5gg is pushed in the lock state, and judges that only fry start key 5cc and heating start key 5ff are operable according to the operation guidance stored in memory 12. Then, illumination controller 8 lights off lock release key 5gg, as shown in FIG. 5C, and controls light-guiding panel 7 to allow fry start key 5cc and heating start key 5ff to illuminate. Upon either fry start key 5cc or heating start key 5ff being operated, heating operation by the heating coil in heater unit 1 starts heating so as to perform the function allocated to the key.

Key indicators 5c and 5d of electrostatic touch key 5 which illuminate are pressed to accept an operation instruction, and thus, key indicators 5c and 5d may blink upon accepting the operation instruction. The user can visually acknowledge the acceptance of the operation instruction, hence being prevented from performing unnecessary operation, such as repeating of the same operation, due to erroneous acknowledgement of the acceptance of the input operation instruction.

In the first lock state, the user operates lock release key 5gg which illuminates. Then, the lock state is released, and the user operates fry start key 5cc or heating start key 5ff which appear. Thus, the user can acknowledge operable keys just looking at top-panel operation unit 3, thereby not needing to read an operation manual to operate the cooker. Further, only operable electrostatic touch keys 5 illuminate, thereby eliminating an operation error, namely touching the other invalid keys.

Range indicator 5d forming the key indicator having the frame shape indicates the operation range of electrostatic touch keys, and allows the operation range of electrostatic touch keys 5 to appear when light-guiding panel 7 emits light, thereby allowing the user to clearly acknowledge the range. Electrode 5b inside range indicator 5d electrically coupled to electrode 5b outside range indicator 5d by capacitive coupling. Hence, electrode 5b inside range indicator 5d functions as an electrode even if operation sensor 6 applies a high-frequency voltage to electrode 5b outside range indicator 5d. The conductive coat may be formed by printing to allow range indicator 5d to have preferable appearance. The shape of range indicator 5d is not limited to the frame shape. Range indicator 5d may have a ring shape or may be formed not with a solid line but with a broken line.

The key indicator includes function indicator 5c indicating the function allocated to electrostatic touch key 5, and thus, function indicator 5c indicating the function of electrostatic touch key 5 appears when light-guiding panel 7 emits light, thereby allowing the user to clearly acknowledge the function. When the finger touches top plate 2 above function indicator 5c, electrode 5b outside function indicator 5c electrically coupled to the finger by capacitive coupling. Therefore, electrostatic touch key 5 can operate even if the finger touches a portion above function indicator 5c. The conductive film of electrode 5b may be formed by printing, thereby allowing makes indicator 5c to have preferable appearance.

Key indicators 5c and 5d which are visible to the user are formed on electrode 5b, and thus, the user can operate the cooker without malfunction as long as the user presses key indicators 5c and 5d which are visible. In addition, this structure eliminates a space on the plate around electrode 5b for dedicated to display for illuminating electrostatic touch key 5. In the case that a desired electrostatic touch key 5 is selected from plural keys or that one electrostatic touch key 5 is shared to perform plural functions in order to reduce the number of electrostatic touch keys 5, the user can easily select desired electrostatic touch key 5 to operate the cooker without malfunction, thereby improving usability of the cooker.

For the predetermined time after power switch 4a is turned on, a predetermined electrostatic touch key, e.g. a key related to a frequently used or important function may illuminate, instead of the operation that all electrostatic touch keys 5aa to 5gg illuminate.

According to Embodiment 1 of the invention, the induction heating cooker, a type of heating cooker, that induction-heat the object with high-frequency magnetic field generated by supplying a high-frequency current to the induction heating coil. However, this technique is applicable to heating cookers having top plates located at the top and performing heating and cooking with heat source, such as gas, halogen, nickel-chrome wire, or sheath heater.

Exemplary Embodiment 2

An appearance and essential structure of a heating cooker according to Exemplary Embodiment 2 of the invention are similar to those of the heating cooker shown in FIGS. 1 to 3, and their detailed descriptions will be omitted.

Figure 6A:
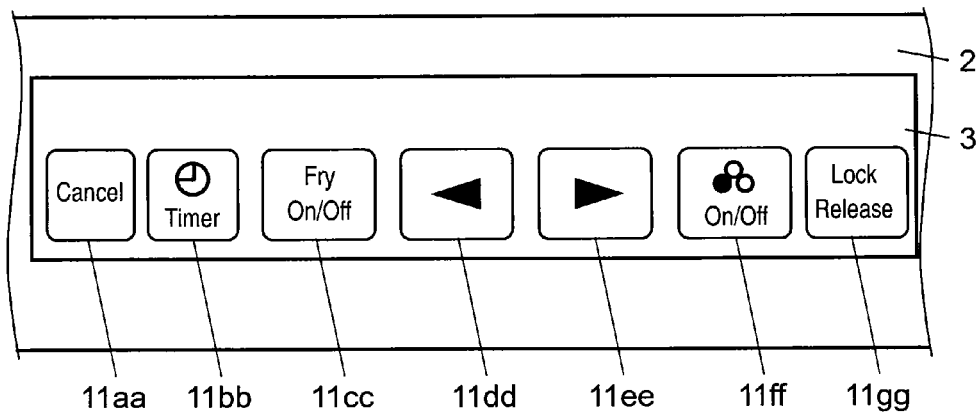
FIG. 6A is a top view of a top-panel operation unit while all light-guiding panels emit light at low brightness in a part of the top-panel operation unit according to Embodiment 2.
Figure 6B:
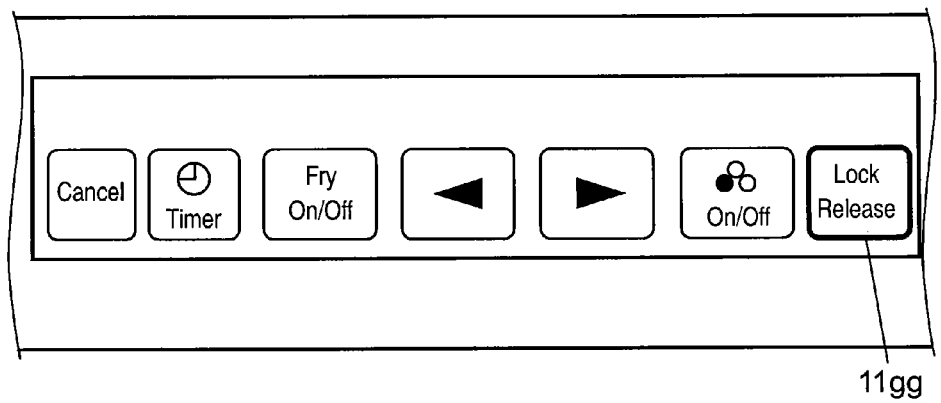
FIG. 6B is a top view of the top-panel operation unit while one light-guiding panel emits light at high brightness.
Figure 6C:
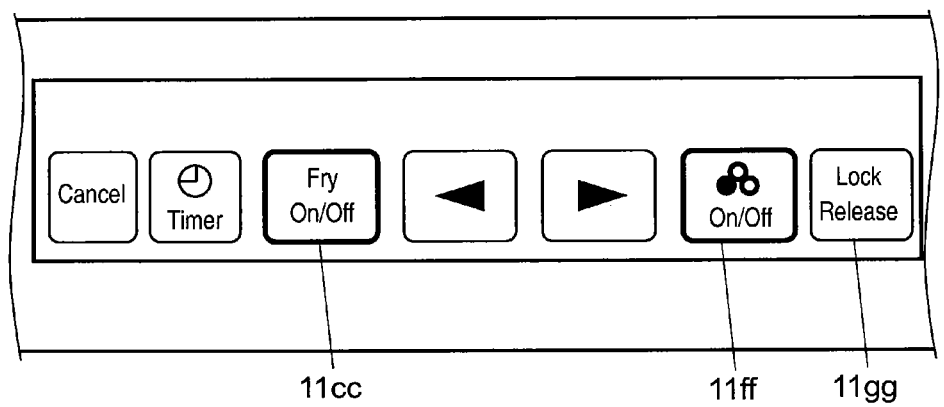
FIG. 6C is a top view of the top-panel operation unit while two light-guiding panels emit light at high brightness.

FIG. 6A is a top view of top-panel operation unit 3 of a heating cooker according to exemplary Embodiment 2 while all light-guiding panels 7 emit light at a second brightness, a predetermined low brightness. FIG. 6B is a top view of top-panel operation unit 3 while one light-guiding panel 7 emits light at a first brightness, a predetermined high brightness higher than the second brightness. FIG. 6C is a top view of top-panel operation unit 3 while two light-guiding panels 7 emit light at the first brightness, the predetermined high brightness. Each of electrostatic touch keys 11aa to 11gg show electrostatic touch key 5 corresponding to each function.

In particular, electrostatic touch key 11gg is a lock release key (referred to as "lock release key 11gg" hereinafter) used to release a lock state of the cooker in which the other keys are inoperable. Electrostatic touch key 11cc is a fry start key (referred to as "fry start key 11cc" hereinafter) used to start frying in a lock release state. Electrostatic touch key 11ff is a heating start key (referred to as "heating start key 11ff" hereinafter) used to start heating for other than frying in the lock release state. The operation unit further includes memory 12 storing operation guidance at corresponding to a specification of the heating cooker. Then, illumination controller 8 controls light-guiding panel 7 of operable electrostatic touch key 5 to emit light at the first brightness, the predetermined high brightness, and controls light-guiding panel 7 of inoperable electrostatic touch key 5 to emit light at the second brightness, the predetermined low brightness lower than the first brightness. Illumination controller 8 controls the light-emitting of light-guiding panel 7 according to an operation guidance stored in memory 12.

An operation of the heating cooker will be described below.

First, the heating cooker allows all keys 11aa to 11gg to illuminate at the second brightness, the predetermined low brightness, for a predetermined time after the cooker is turned on, as shown in FIG. 6A, in order to have the user to recognize functions the cooker provides. In this case, the heating cooker may allow the key to illuminate at the first brightness higher than the second brightness. The illumination at the second brightness has the user acknowledge low priority.

After the predetermined time elapses, the heating cooker shifts to a lock state, and allows only lock release key 11gg to illuminate at the first brightness, the predetermined high brightness, as shown in FIG. 6B. At this moment, only lock release key 11gg is operable. When the user touches lock release key 11gg, operation sensor 6 detects that lock release key 11gg is touched, and notifies illumination controller 8 that lock release key 11gg is touched. Controller 8 establishes a lock release state if lock release key 11gg is pressed in the lock state, and judges that only fry start key 11cc and heating start key 11ff are operable according to the operation guidance stored in memory 12. Then, as shown in FIG. 6C, controller 8 returns lock release key 11gg to the original second brightness, and then allows fry start key 11cc and heating start key 11ff to illuminate at the first brightness, the high brightness. Further, controller 8 controls light-guiding panel 7 to allow the other keys to illuminate at the second brightness lower than the brightness at which fry start key 11cc and heating start key 11ff illuminate.

In the first lock state, the user operates lock release key 11gg illuminating at the high brightness (the first brightness). Then, the user operates fry start key 11cc or heating start key 11ff starting illuminating when the lock is released. Thus, the user may not necessarily read an operation manual to operate the cooker since the user acknowledges operable electrostatic touch keys 5 only by looking at top-panel operation unit 3. Further, only operable electrostatic touch keys 5 illuminate at the high brightness, the first brightness, thereby reducing operation errors, namely, preventing the other invalid keys from being touched.

Exemplary Embodiment 3

An appearance and essential structure of a heating cooker according to Exemplary Embodiment 3 of the invention are similar to those of the heating cooker shown in FIGS. 1 to 3, and their detailed descriptions will be omitted.

Figure 7:
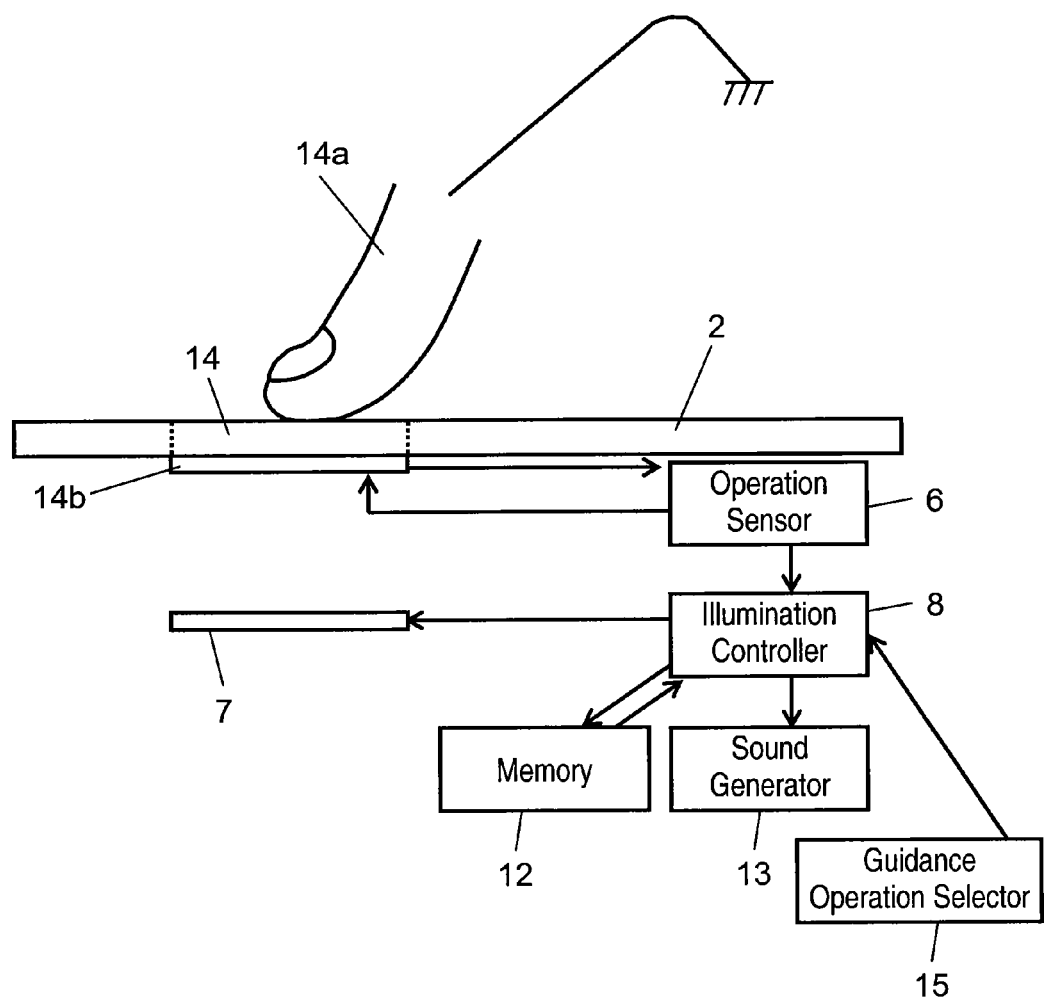
FIG. 7 is a block diagram of an operation unit of a heating cooker according to Exemplary Embodiment 3.

FIG. 7 is a block diagram of an operation unit of the heating cooker according to Embodiment 3 of the invention.

As shown in FIG. 7, the operation unit essentially includes memory 12 storing operation procedures of the heating cooker, sound generator 13, electrostatic touch key 14 having electrode 14b pressed by finger 14a, and guidance operation selector 15.

Electrostatic touch key 14 forms a capacitor between finger 14a and electrode 14b. Electrode 14b is provided on a surface of top plate 2 opposite to a surface of top plate 2 arranged to have an object (not shown) placed thereon, namely, on the lower surface of top plate 2. Finger 14a touching the surface arranged to have the object (not shown) placed thereon. A high-frequency voltage is applied to electrode 14b from an oscillator (not shown) in operation sensor 6.

Operation sensor 6 detects that electrostatic touch key 14 is operated by detecting that the voltage appears on electrode 14b drops by more than a predetermined difference due to impedance between electrode 14b and a common potential decreasing when finger 14a touches the upper surface of top plate 2 above electrode 14b to bypass a high-frequency current to a ground through top plate 2 and finger 14a.

An operation of the heating cooker will be described below.

Figure 8A:
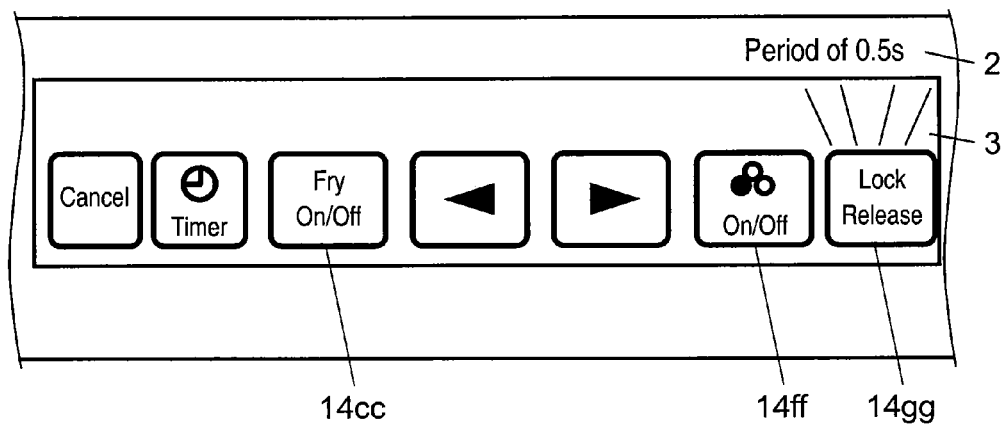
FIG. 8A is a top view of a top-panel operation unit while all light-guiding panels emit light and one of the light-guiding panels blinks.
Figure 8B:
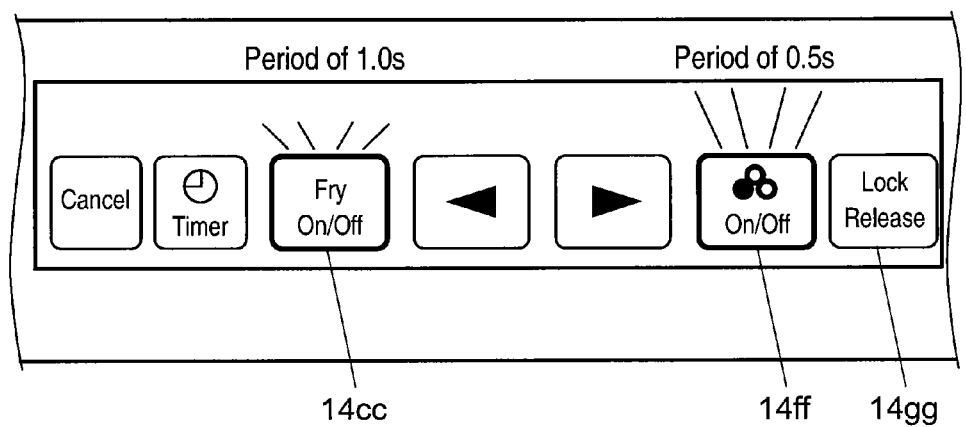
FIG. 8B is a top view of the top-operation unit while all the light-guiding panels emit light at low brightness and two of the light-guiding panels blink.
Figure 9:
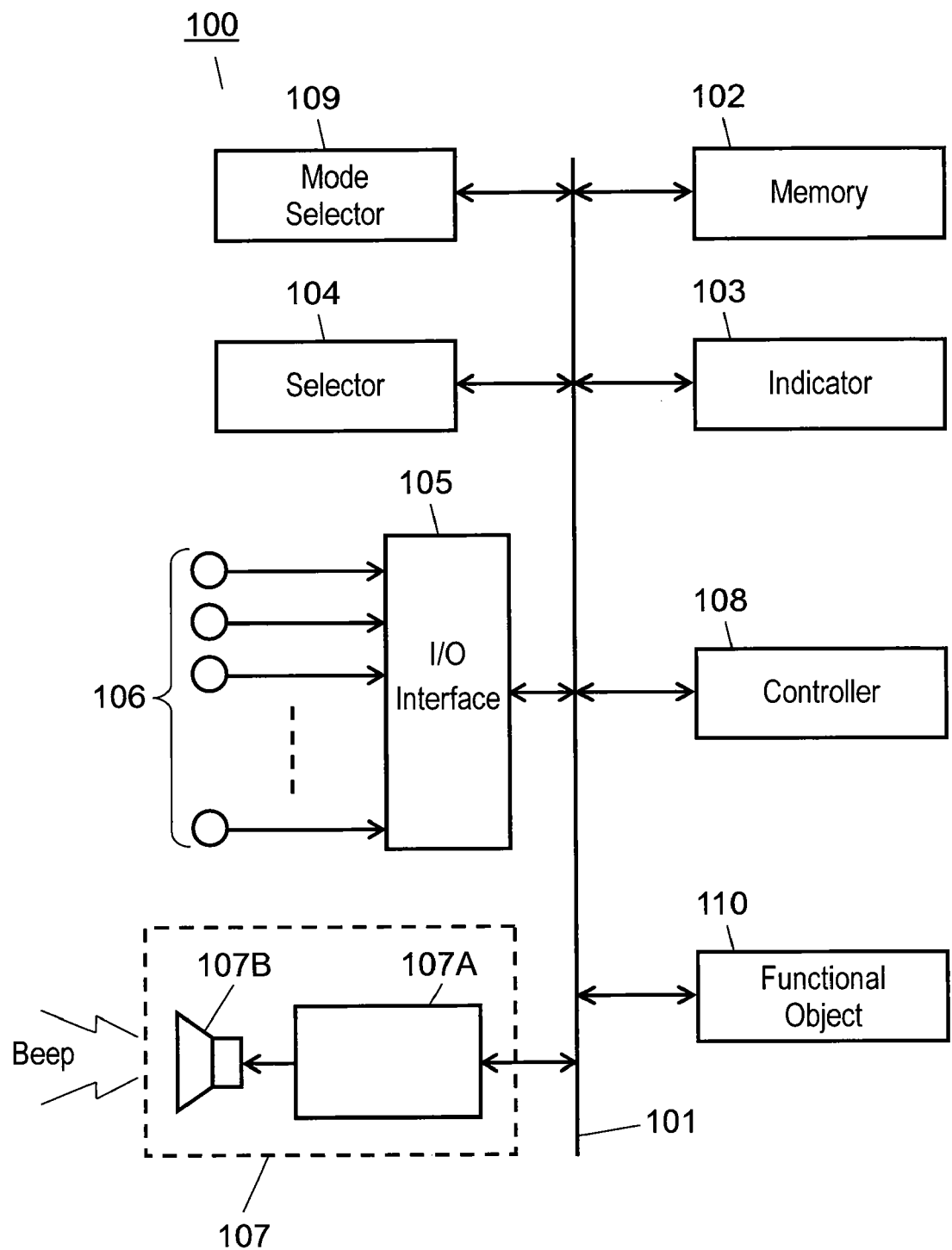
FIG. 9 is a block diagram of a conventional heating cooker as a conventional electronic appliance.

FIG. 8A is a top view of top-panel operation unit 3 of the heating cooker according to Embodiment 3 while all light-guiding panels 7 emit light at high brightness and one of the panels blinks at a part of top-panel operation unit 3. FIG. 8B is a top view of top-panel operation unit 3 while all light-guiding panels 7 emit light at a low brightness and two of the panels blink.

Electrostatic touch key 14gg is a lock release key (also referred to as "lock release key 15gg" hereinafter) used to release a lock state of the cooker in which the other keys are inoperable. Electrostatic touch key 14cc is a fry start key (also referred to as "fry start key 14cc" hereinafter) used to start frying in a lock release state. Electrostatic touch key 14ff is a heating start key (also referred to as "heating start key 14ff" hereinafter) used to start heating for other than frying in the lock release state.

Heating start key 14ff is used more frequently than fry start key 14cc, and thus heating start key 14ff is prioritized in operation guiding. Information about which keys are operable in each state, and which keys are frequently used and preferentially guided is previously stored in memory 12.

When the heating cooker is in the lock state shown in FIG. 8A, illumination controller 8 receives information from memory 12 that an operable key is lock release key 14gg and controls light-guiding panel 7 to allow only lock release key 14gg to blink at a period of 0.5 sec. Illumination controller 8 further sends an instruction to sound generator 13 to generate a message for encouraging the user to start operation, and sound generator 13 generates a message.

At this moment, as shown in FIG. 8A, all the electrostatic touch keys illuminate for a predetermined time to inform the user of functions of the cooker. However, the present invention is not limited to this embodiment, but all the electrostatic touch keys may not necessarily illuminate.

When the user operates lock release key 14gg, operation sensor 6 detects that lock release key 14gg is operated and notifies illumination controller 8 that lock release key 14gg is operated. Illumination controller 8 establishes a lock release state if lock release key 14gg is pressed in the lock state and judges that only fry start key 14cc and heating start key 14ff are operable to terminate the blinking of lock release key 14gg. Than, illumination controller 8 receives information from memory 12 that operable keys are fry start key 14cc and heating start key 14ff, and particularly heating start key 14ff is preferentially guided. Then, as shown in FIG. 8B, illumination controller 8 controls light-guiding panel 7 to allow the two keys to blink at different periods, for example, to allow fry start key 14cc and heating start key 14f to blink at periods of 1.0 sec. and 0.5 sec, respectively. Illumination controller 8 sends an instruction to sound generator 13 to generate a message for encouraging the user to start operation, or a message for explaining the meaning of the illumination state (the difference of the blinking period), and sound generator 13 generates a corresponding message. A supplementary explanation from sound generator 13 allows the user to perform next operation easily and properly.

At this moment, as shown in FIG. 8B, the electrostatic touch keys other than fry start key 14cc and heating start key 14ff illuminate at a low brightness. However, the present invention is not limited to this embodiment, but the other keys may not necessarily illuminate at the low brightness.

The user recognizes that a key blinking at a short period is to be preferentially operated only by looking at top-panel operation unit 3, and thus, the user does not need to read an operation manual to operate the cooker. Further, only operable electrostatic touch keys 14 blink, thereby reducing operation errors, namely touching the other invalid keys.

In the case that the user operates guidance operation selector 15 to disable the operation guiding, all the electrostatic touch keys illuminate regardless of the state of the cooker, as shown in FIG. 5A, and the operation guiding is not performed. The cooker refrains from guidance operation to meet a requirement of a user who regards the operation guiding, such as the blinking of the keys, as meddling after the user acquire the function and operation method of each key. Guidance operation selector 15 is provided on an outer surface of the heating cooker (not illustrated). For example, a switch as guidance operation selector 15 may be provided on a kangaroo-type operation unit or another position, which is not particularly limited.

According to the above embodiments, top plate 2 is made of heat-resistant glass made of crystallized ceramic, but may be made of transparent resin. Instead of the forming of the print film on top plate 2 and coloring the film, top plate 2 may have a half-mirrored print film or deposited film thereon, or the color of a side of electrode 5b directed toward top plate 2 may be identical to the color of light-guiding panel 7 that does not emit light. This arrangement prevents the key indicators from being visible while light-guiding panel 7 does not emit light.

INDUSTRIAL APPLICABILITY

An operation unit of a heating cooker according to the present invention is useful particularly for an induction heating cooker including a top plate provided on its upper surface, however, is applicable to an operation unit of a heating cooker including a heat source, such as gas or halogen. A user can operate the heating cooker smoothly since the user knows next available operation without reading an operation manual. Invalid electrostatic touch keys are out of sight of the user, thereby reducing operation errors. Further, electrostatic touch keys are ordinarily invisible and appear only when the keys are to be used, thereby improving the design of the operation unit.

The invention claimed is:

1. A heating cooker comprising:
a top plate placed on an upper surface of the heating cooker;
electrostatic touch keys provided on a lower surface of the top plate and directing functions allocated thereto to be performed, the electrostatic touch keys each including an electrode made of a conductive film having predetermined light-blocking property and being provided on a lower surface of the top plate, the conductive film of each electrostatic touch key being partially removed in a shape representing a graphical image or a character image;
an operation sensor detecting changes of capacitances between the electrostatic touch keys and a ground, the changes of the capacitances being produced by touches of the top plate at locations facing the electrodes of the electrostatic touch keys while an alternating-current signal is applied to the electrodes, respectively;
operation-unit illuminators which emit light toward the electrodes of the electrostatic touch keys from a direction opposite to the top plate, respectively; and
an illumination controller controlling illumination of the operation-unit illuminators, wherein
the illumination controller controls the operation-unit illuminators to emit light, which goes through the electrostatic touch keys to project to the top plate the graphical images or the character images formed by the conductive films so that the graphical images or the character images are visible through the top plate.

2. The heating cooker according to claim 1, wherein
the electrostatic touch keys are provided on a top-panel operation unit formed on the top plate, and
the top-panel operation unit is colored so as to prevent the graphical images or the character images formed by the conductive films of the electrostatic touch keys from being visible through the top late while the operation-unit illuminators do not emit light.

3. The heating cooker according to claim 2, wherein the top-panel operation unit is constituted by a portion of the top plate, the portion of the top plate being made of colored crystallized ceramic.

4. The heating cooker according to claim 2, wherein the top-panel operation unit has a colored print film formed on the lower surface of the top plate.

5. The heating cooker according to claim 2, wherein the top-panel operation unit has a film having a half-mirror effect formed on the lower surface of the top plate.

6. The heating cooker according to claim 2, wherein the electrostatic touch key has a surface facing the top plate which is colored identically to a color exhibited by a surface of a corresponding operation-unit illuminator facing the electrostatic touch key when the corresponding operation-unit illuminator does not emit light.

7. The heating cooker according to claim 1, wherein the graphical image or character image includes a rim indicating an area in which the electrostatic touch key is operable.

8. The heating cooker according to claim 1, wherein the graphical image or the character image functions are allocated to the electrostatic touch keys, respectively.

9. The heating cooker according to claim 1, further comprising
a memory storing an operation guidance determining an illumination state of the operation-unit illuminators while the heating cooker is operated according to a series of operation procedures,
wherein the illumination controller changes the illumination state of the operation-unit illuminators according to the operation guidance input from the memory.

10. The heating cooker according to claim 9, wherein the illumination controller directs one of the operation-unit illuminators to emit light towards a corresponding electrostatic touch key when the corresponding electrostatic touch keys is made operable, and directs said one of the operation-unit illuminators not to emit light when the corresponding electrostatic touch keys is made inoperable.

11. The heating cooker according to claim 10, further comprising:
a lock release key which is one of the electrostatic touch keys and, upon operated when the heating cooker is in a lock state in which electrostatic touch keys other than the lock release key are inoperable, shifts the heating cooker from the lock state to a state in which the other electrostatic keys are operable; and
a power switch which, upon operated, shifts the heating cooker from a state that all the electrostatic touch keys are inoperable to the lock state,
wherein when the power switch is operated, the illumination controller operates to implement:
turning on at least some of the operation-unit illuminators to illuminate corresponding electrostatic touch keys for a predetermined time;
turning off the at least some of the operation-unit illuminators after the predetermined time except for an operation-unit illuminator for the lock release key; and
turning off the operation-unit illuminator for the lock release key when the lock state is released.

12. The heating cooker according to claim 9, wherein the illumination controller directs one of the operation-unit illuminators to emit light at a predetermined first brightness towards a corresponding electrostatic touch key when the corresponding electrostatic touch keys is made operable, and directs said one of the operation-unit illuminator to emit light towards the corresponding electrostatic touch key at a predetermined second brightness lower than the first brightness when the corresponding electrostatic touch keys is made inoperable.

13. The heating cooker according to claim 9, further comprising
a guidance operation selector that disables, according to the operation guidance stored in the memory, illumination control performed on the operation-unit illuminators,
wherein, while the guidance operation selector disables the illumination control, and at least one of the electrostatic touch keys is operable, the illumination controller directs all the operation-unit illuminators to illuminate all the electrostatic touch keys in order to inform a user of functions and positions of the electrostatic touch keys.

14. The heating cooker according to claim 9, wherein the illumination controller directs one of the operation-unit illuminators to turn on and off to notify a user that an operation is accepted.

15. The heating cooker according to claim 9, further comprising:
a lock release key which is one of the electrostatic touch keys and, upon operated when the heating cooker is in a lock state in which electrostatic touch keys other than the lock release key are inoperable, shifts the heating cooker from the lock state to a state in which the other electrostatic keys are operable; and a power switch which, upon operated, shifts the heating cooker from a state that all the electrostatic touch keys are inoperable to the lock state, wherein when the power switch is operated, the illumination controller operates to implement:

turning on at least some of the operation-unit illuminators to illuminate corresponding electrostatic touch keys for a predetermined time;

turning off the at least some of the operation-unit illuminators after the predetermined time except for an operation-unit illuminator for the lock release key; and turning off the operation-unit illuminator for the lock release key when the lock state is released.

* * * * *